United States Patent

[11] 3,566,005

[72] Inventor Joseph M. Shaheen
La Habra, Calif.
[21] Appl. No. 804,170
[22] Filed Mar. 4, 1969
[45] Patented Feb. 23, 1971
[73] Assignee North American Rockwell Corporation

[54] CIRCUIT BOARD WITH WELD LOCATIONS AND PROCESS FOR PRODUCING THE CIRCUIT BOARD

1 Claim, 9 Drawing Figs.

[52] U.S. Cl. .......... 174/68.5, 29/625, 29/626, 317/101
[51] Int. Cl. .......... H05k 1/18, H05k 3/32
[50] Field of Search .......... 174/68.5; 317/101 (B), 101 (C), 101 (CC), 101 (CM), 101 (D); 29/625, 626

[56] References Cited

UNITED STATES PATENTS 3,202,755 8/1965 Oswald .......... 174/68.5
3,374,306 3/1968 Bradham III .......... 174/68.5X
3,431,350 3/1969 Haberecht .......... 174/68.5
3,102,213 8/1963 Bedson et al. .......... 174/68.5
3,469,019 9/1969 Reimann .......... 174/68.5

*Primary Examiner*—Darrell L. Clay
*Attorneys*—William R. Lane, L. Lee Humphries and Robert G. Rogers

ABSTRACT: A nickel layer insulatively laminated over a circuit pattern of a circuit board is etched to produce weld locations at certain points on said circuit board. In one embodiment, the nickel layer is insulatively laminated over the outer surface of a multilayer board and etched to produce weld sites where an electrical connection between the circuits of the multilayer board and an electrical compound, device, etc. is required.

In another embodiment, the weld sites are produced for making welded pin terminations on said board. For that embodiment, a metal pin is inserted in a plated through hole. One end of the pin is bent over and welded to the nickel weld sites so that it is secured within the hole. The other end protrudes from the circuit board for use as a pin termination so that the circuit board can be interconnected with other electrical circuits.

INVENTOR.
JOSEPH M. SHAHEEN

BY

Robert G. Rogers

ATTORNEY

INVENTOR.
JOSEPH M. SHAHEEN
BY
Robert G. Rogers
ATTORNEY

CIRCUIT BOARD WITH WELD LOCATIONS AND PROCESS FOR PRODUCING THE CIRCUIT BOARD

BACKGROUND OF THE INVENTION

1. Field of the Invention

The invention relates to circuit boards with weld locations and processes for producing such boards and more particularly to a circuit board with weld locations and a process for producing said board in which a nickel layer on the surface of said board is etched to provide the weld locations.

2. Description of Prior Art

There is no apparent art which teaches producing weld sites on a circuit board for either a multilayer board or a circuit termination board. In the known processes, a pin is either soldered in the hole or brazed to the terminal area of the wiring to produce a pin termination on a circuit board. Both processes produce pin terminations which are inherently unreliable. For example, the soldered pin has a tendency to become desoldered during the assembly of the circuit board in an electronic system. Brazing of a pin to the circuit board often causes delamination along the edge of the board due to the stresses involved in laminating a cover coat around the pins.

The present invention resolves the above problems by providing a board which includes nickel weld sites for use as weld locations for pins and as weld sites for circuit leads such as leads from an integrated circuit.

SUMMARY OF THE INVENTION

Briefly, the invention comprises a circuit board having nickel sections insulatively disposed over a circuit pattern of the circuit board for providing weld sites for leads or pins forming pin terminations from said circuit board.

In the latter embodiment, the pins are inserted in a plated-through hole in the circuit, bent over and welded to the site at one end of the pin. The other pin protrudes from the through hole on the opposite side of the circuit board for use as a pin termination from said circuit.

In the former embodiment, it is often desirable to weld integrated circuits and similar electronic assemblies to the surface of a circuit board such as a multilayer circuit board. For such an application, leads of the integrated circuit could be welded to selected weld sites on the circuit board surface.

The weld sites are produced by etching a nickel layer previously insulatively laminated to the outer surface of a circuit board. The weld sites are produced at locations where it is desired to produce pin terminations on said circuit board or as indicated above where it is desired to connect an electronic assembly.

Prior to etching the nickel layer, through holes are plated to provide electrical interconnections through the holes. After the holes have been plated, the nickel layers are etched. In certain embodiments, only one side of a board may be provided with the weld sites. In that case, only one nickel layer need be laminated to the board.

Therefore, it is an object of this invention to provide a circuit board having weld locations.

It is still another object of this invention to provide a process for producing a circuit board having weld locations.

It is another object of this invention to provide a circuit board having pins passing through holes in said board and having one end of the pins welded to nickel weld locations on one surface of the board for securing the pins to the board so that the unwelded ends of the pins protruding from the opposite side of the board provide pin terminations for said circuit board.

A still further object of this invention is to provide a multilayer circuit board having weld sites to which leads of integrated circuits and other electronic components and devices can be welded.

It is another object of this invention to provide a circuit board with nickel weld sites for reducing desoldering which occurs when using soldered pins.

Still another object of this invention is to provide a circuit board in which delamination caused by brazing pins to the circuit board is reduced.

These and other objects of the invention will become more apparent during the description of the preferred embodiments, a brief description of which follows:

DESCRIPTION OF THE PREFERRED EMBODIMENTS

Figure 1A:
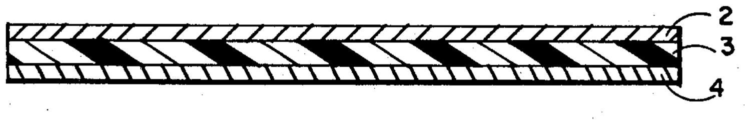
FIG. 1*a* illustrates a copper clad laminate.

FIG. 1*a* is a side view of board 1 comprising copper layers 2 and 4 which are laminated to insulating layer 3. A suitable epoxy-glass material may be used as the insulating layer. Although copper is described herein as the circuit material, it should be understood that other conductor materials may also be used.

Figure 1B:
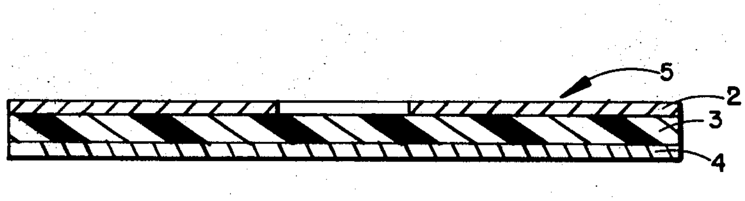
FIG. 1*b* illustrates a copper clad laminate which has been etched to produce a circuit pattern on one side.

FIG. 1*b* is a side view of the FIG. 1*a* board after the copper layer 2 has been etched into a desired circuit pattern 5. The board may be etched for example by photo etching techniques well known in the art. Although only one layer was etched, both layers may be etched in other embodiments.

Figure 1C:
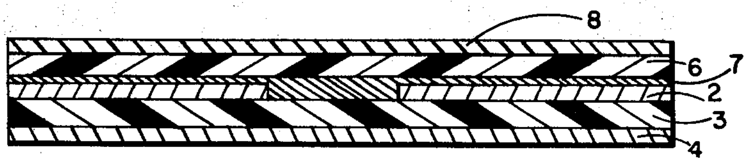
FIG. 1*c* illustrates an etched circuit board having a nickel layer insulatively laminated to the surface of the board.

FIG. 1*c* is a side view of the FIG. 1 *b* assembly after insulating layer 6 has been bonded to surface of circuit 5 by adhesive 7. Nickel layer 8 is also shown laminated to insulating layer 6. Known techniques may be used to apply the heat and pressure necessary to laminate the nickel layer to the insulating layer.

Figure 1D:
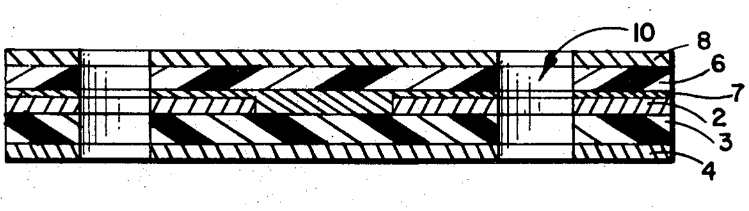
FIG. 1*d* illustrates a circuit board in which through holes have been produced.

FIG. 1*d* is a side view of the FIG. 1*c* assembly showing holes 9 and 10. The holes may be mechanically or chemically drilled through the board at desired locations. For example, if the circuit is a conductor pattern which has terminal areas, the holes would be drilled through the board at those areas.

Figure 1E:
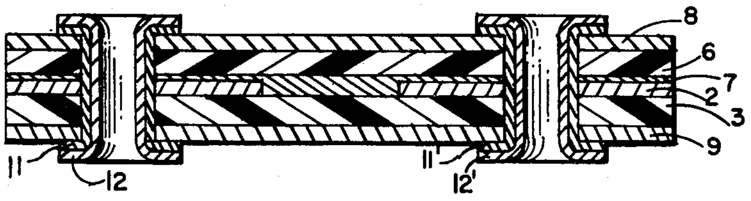
FIG. 1*e* illustrates a circuit board having plated-through holes.

FIG. 1*e* shows the FIG. 1 *d* assembly after the holes 9 and 10 have been plated by electroless layers 11 and 11' of copper followed by a plated layers 12 and 12' of gold. In a preferred electroless plating solution, a 10 percent $H_2SO_4$ acid solution is substituted for the accelerator to produce copper adhesion to the nickel layer around the holes.

Figure 1F:
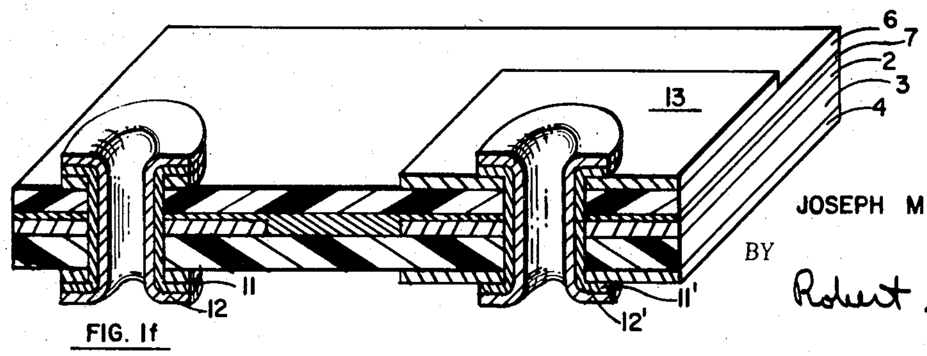
FIG. 1*f* illustrates a circuit board in which the nickel layer has been etched to produce weld sites at desired locations on the surface of said circuit board.

FIG. 1*f* shows the FIG. 1*e* assembly after the nickel layer 8 and copper layer 4 have been etched into desired configurations. The nickel layer 8 is etched into rectangular parts which serve as weld locations, or site, on the surface of the insulating layer 6. One example of a rectangular weld side is illustrated in the FIG. as weld site 13. For convenience, only one weld site is shown. Etching solutions and processes for sequentially etching the copper and nickel layers are well known to persons skilled in the art.

Figure 1G:
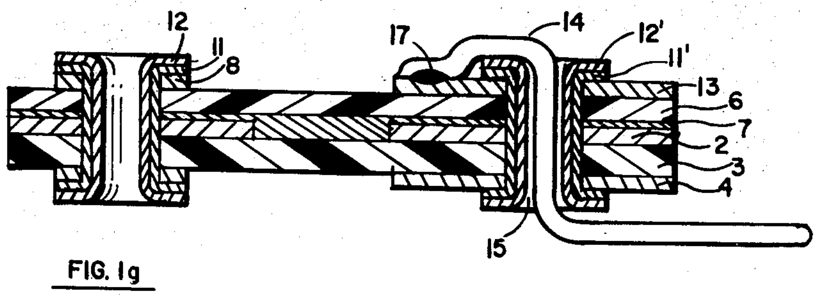
FIG. 1*g* illustrates a circuit board in which a pin has been passed through one hole and welded to a weld at one end for producing a welded pin termination on said circuit board.

In FIG. 1*g*, metal pin 14 is passed through hole 10 of the FIG. 1*f* assembly. The pin has a cross-sectional area which approximately matches the circular cross-sectional area of the plated-through 15 hole so that the pin surface is in contact with gold layer 12'. End 16 of the pin is bent over into contact with weld site 13 and welded at point 17 by resistance welding techniques. It may be welded at more than one location if required for increased security. End 18 of the pin protrudes from the hole 15 on the opposite side of the assembled circuit board. It has a length for mating with other electronic assemblies such as a female receptacle (not shown). Electrical connections can be made through the pin and through other pins (not shown) to the circuit 5 of the board.

FIGS. 1*a* through 1*g* illustrated a process for producing weld sites on a single layer circuit board. In one embodiment, the single circuit layer may comprise part of a flexible wiring assembly which is used to interconnect an electronic system to a source of power etc.

Figure 2A:
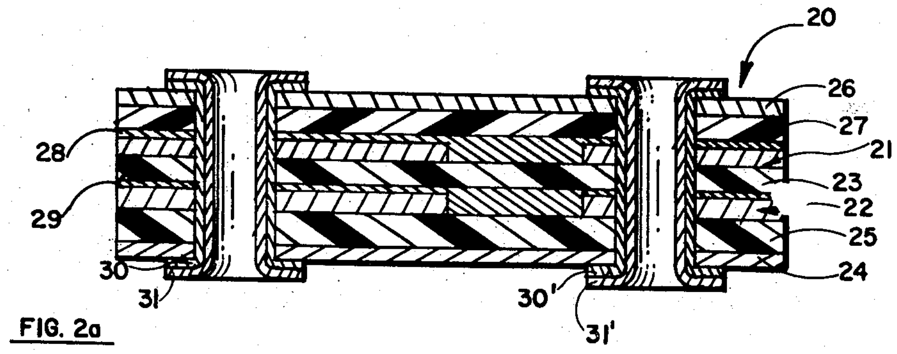
FIG. 2*a* illustrates a multilayer board having a laminated nickel layer on one surface.

FIG. 2*a* illustrates a multilayer board 20 produced substantially by the techniques shown and described in connection with FIGS. 1*a* through 1*g*. The multilayer board comprises circuit layers 21 and 22 separated by insulating layer 23.

Copper layer 24 is laminated to the bottom surface of the board and is separated from circuit 22 by insulating layer 25. Nickel layer 26 is laminated to the top surface of the board and is separated from circuit 21 by insulating layer 27. Bonding layers 28 and 29 of adhesives secure insulating layers 23 and 27 in place and circuit layers 22 and 21 respectively.

Plated layers 30, 30', 31 and 31' interconnect the circuit without layers 24 and 26.

Figure 2B:
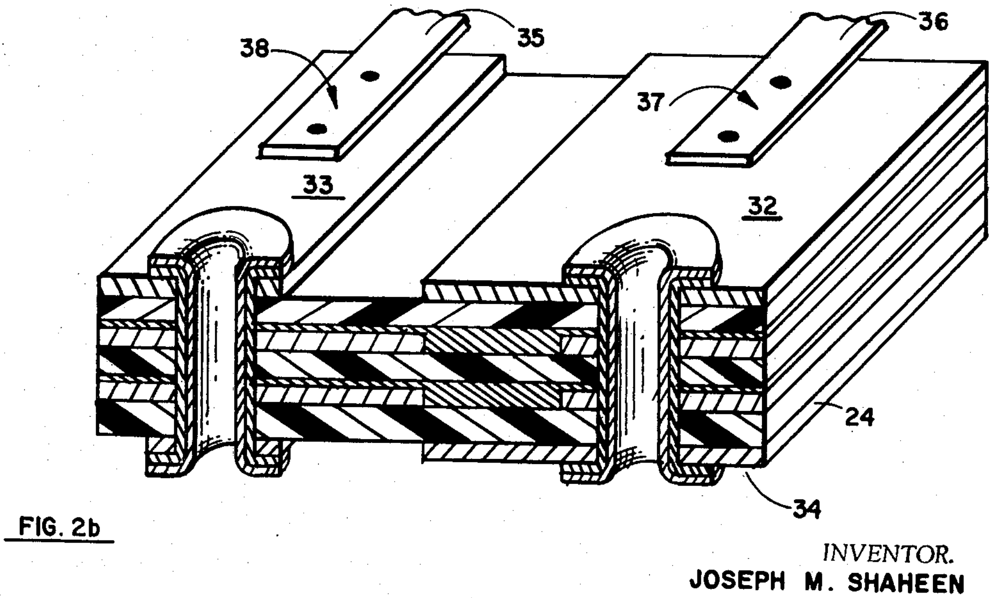
FIG. 2*b* illustrates a multilayer board having etched weld sites produced on the surface of said board.

FIG. 2*b* shows the FIG. 2*a* board after nickel layer 26 has been etched into weld sites represented by the weld site 32 and 33. Other weld sites are omitted for convenience. If a complete board had been illustrated, additional sites would have been visible. Copper layer 24 is also shown as having been etched into a circuit pattern 34. The nickel and copper layers were etched by processes as described in connection with FIGS. 1*a* through 1*g*. After the nickel layer has been etched to form the weld sites shown, the board can be used as weld locations for the lead of electronic devices such as integrated circuits, capacitors, resistors, etc. Leads 35 and 36 of integrated circuits (not shown) are illustrated as being welded to weld sites 32 and 33 at locations 37 and 38.

While the invention has been described with respect to several physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:

1. An attachment to a circuit board, said circuit board comprising an electrical circuit interposed between two dielectric layers;

plated-through holes extending through said layers;

horizontally disposed nickel weld locations on both the exposed surfaces of said dielectric layers, said weld locations being secured directly to the dielectric layers adjacent the plated-through holes; and said plated-through holes electrically connecting said weld locations and said electrical circuit, said plated-through holes each including a plated layer disposed on top of the outer surfaces of said nickel weld locations.